United States Patent [19] [11] 4,419,580
Walker et al. [45] Dec. 6, 1983

[54] ELECTRON BEAM ARRAY ALIGNMENT MEANS

[75] Inventors: David M. Walker, Westford; John J. Carrona, Concord, both of Mass.

[73] Assignee: Control Data Corporation, Minneapolis, Minn.

[21] Appl. No.: 277,554

[22] Filed: Jun. 26, 1981

[51] Int. Cl.³ .......................... G21K 1/08; G21K 5/00
[52] U.S. Cl. .............................. 250/396 R; 250/491.1
[58] Field of Search ............... 313/360, 361, 363, 458; 250/492.2, 358, 396 R, 396 ML, 505.1, 491.1

[56] References Cited

U.S. PATENT DOCUMENTS 2,501,882 3/1950 Trump et al. ..................... 313/360.1
3,262,262 7/1966 Reader et al. ..................... 313/361.1
4,200,794 4/1980 Newberry et al. ................ 250/492.2
4,288,697 9/1981 Albert ............................... 250/505.1

Primary Examiner—Bruce C. Anderson
Attorney, Agent, or Firm—Edward P. Heller, III; Joseph A. Genovese

[57] ABSTRACT

An electron beam lens and deflector array mounting and alignment means are provided. The array is a structure composed of several parallel plates which are held in parallel and axial alignment. The mounting means comprises four slots, one at the end of the four corners of an imaginary rectangle, formed in each facing plate surface. Four cylindrical spacer rods are sandwiched between the plates, each seated in two facing slots.

8 Claims, 4 Drawing Figures

ELECTRON BEAM ARRAY ALIGNMENT MEANS

BACKGROUND OF THE INVENTION

1. Field of the Invention

The invention relates to the field of electron beam lenses and deflectors and more particularly to their array structures.

2. Brief Description of the Prior Art

The array structure of an electron beam lens and deflector gun is comprised of two parallel plate subassemblies: a plurality of lens plates and two fine deflector plates. The lens plates are essentially a grid of apertures, while the two deflector plates are sets of parallel conductive blades. The blades of one plate are oriented orthogonally to the other plate. The lens plates are commonly composed of silicon while the fine deflector plates are composed of a conductive metal.

Array structures have to be precisely aligned. To accomplish this, previous array structures have included optical alignment techniques with glass rodding and mechanical referencing to supporting rings as a means to axially align, space and fasten together the array assembly. This requires considerable precision opto-mechanical fixturing to achieve assembly and an elaborate supporting superstructure or cage to hold the subassemblies in position. See, e.g., U.S. Pat. No. 4,200,794 to Newberry et al., assigned to the Control Data Corporation.

For electron beam array lithography, the array design has an outside nominal dimension of approximately one inch. In this environment, opto-mechanical fixturing becomes prohibitively difficult due to the lack of area on the perimeter of the array elements. It is similarly prohibitively difficult to incorporate a supporting superstructure in the limited space available surrounding a one inch array.

SUMMARY OF THE INVENTION

The axial alignment and interplate spacing of the array lens and fine deflector plates is accomplished in the present invention by placing precision-ground ceramic cylindrical rods or tubes of appropriate diameter into slots etched in the silicon lens plates and machined into the fine deflector blades. In a preferred embodiment there are four such cylinders and eights slots in the two facing surfaces of any two plates to be aligned and spaced. The slots are placed at the corners of an imaginary rectangle with the slots diagonally opposite being parallel to each other and the slots at adjacent corners orthogonal. The plates are then held together by a biasing means, such as a spring, for subsequent disassembly purposes or by a bonding means such as a glass bond formed by heated powdered glass at the rod/slot joints.

DESCRIPTION OF THE PREFERRED EMBODIMENT

Figure 1:
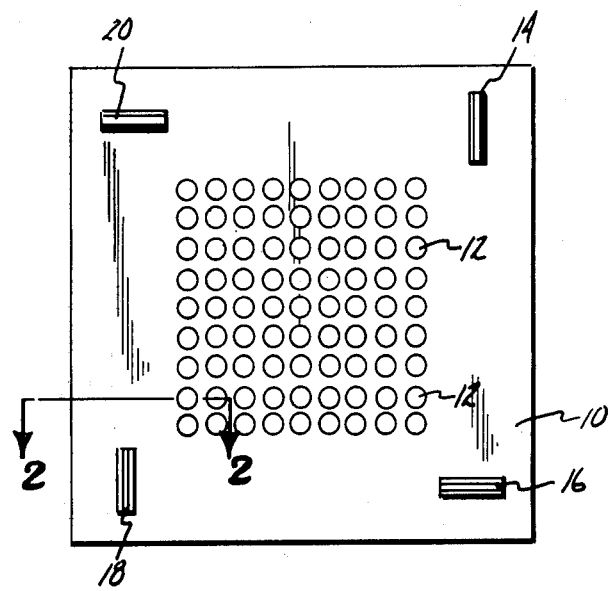
FIG. 1 is a plan view of a silicon lens plate having a nine by nine array of circular holes therein and showing formed on the surface thereof four slots of the present invention.

Referring to FIG. 1, a plan view of a lens plate 10 is shown. The lens plate 10 is composed of silicon. The lens elements are fabricated from 100 orientation silicon wafers each having a nine by nine array of circular holes 12 of precise roundness etched therethrough. The holes are formed by anisotrophic etching in a solution of ethylene diaminepyrocatechol-water (EPW) masked by a four micrometer deep boron diffusion. The boron diffusion layer serves as an etch-stop allowing for precision holes to be defined in the four micrometer thick silicon membrane supported by the undercut bulk silicon wafer 10.

Also etched at the same time as the precision holes 12 are four rectangular slots 14, 16, 18 and 20 which are thereby precision aligned to the nine by nine array of holes 12. The slots are etched into the plate 10 at the four corners of an imaginary rectangle. Slots at opposite corners of the rectangle, such as 14 and 18, are parallel to each other while slots at adjacent corners, such as 18 and 20, are orthogonal to each other. This arrangement provides two dimensional stability to the resulting structure as will be understood presently.

Figure 2:
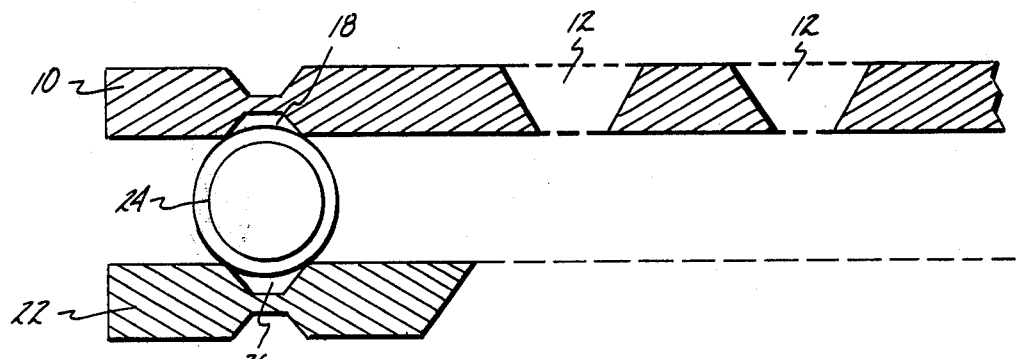
FIG. 2 is a cross-section taken along line 2—2 of FIG. 1.

Referring to FIG. 2, a partial cross-sectional view along line 2—2 in FIG. 1, two of the lens plates 10 and 22 are shown mounted in a spaced and aligned relationship by sandwiching cylindrical hollow rod 24 between them. The cylindrical rod 24 is seated in the opposed slots of the two plates namely slot 18 and slot 26. The diameter of the cylindrical rod 24 and the width of the slot 26 are chosen such that the circumference of the rod 24 rests on the edges of the slots 18 and 26 substantially as shown. Were the rod 24 to bottom out on a slot, a freedom of motion would be allowed to that plate as well as an inaccuracy in the spacing between the respective plates 10 and 22.

As can be seen from the Figure, cylindrical rod 24 is shown hollow. It may be appreciated that cylindrical rod 24 may also be made solid.

The cylindrical rod 24 is preferably composed of a ceramic material that allows the rod to be both light weight and resistant to high temperatures. The latter requirement becomes more clear when considering the glass bonding technique to be discussed below. Ceramic material also acts as a high voltage insulator between plates 10, 22.

Figure 3:
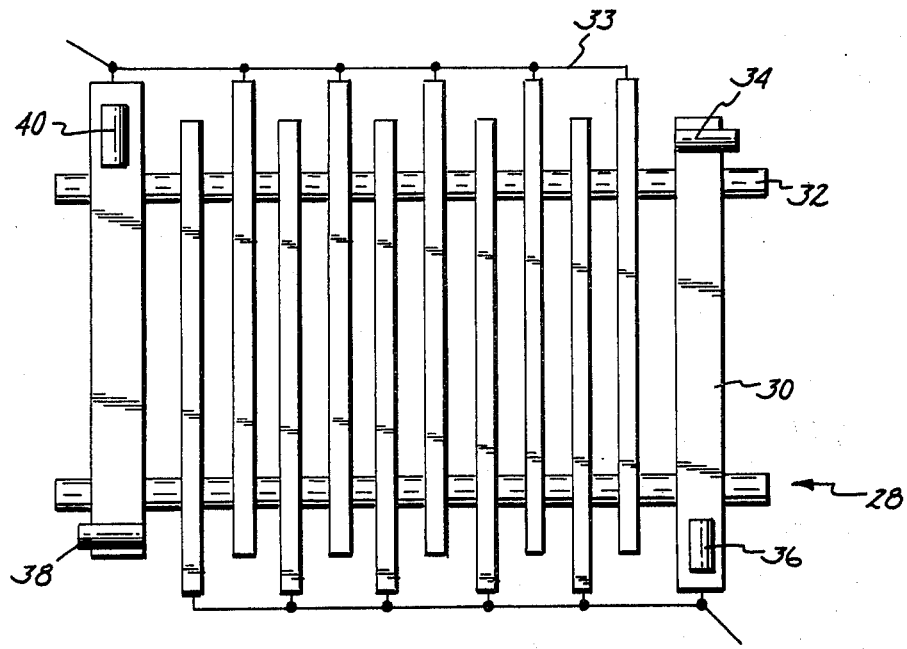
FIG. 3 is a plan view of a parallel blade fine deflector plate having mounted at the four corners thereof the slots of the present invention.

Referring to FIG. 3, a plan view of a parallel blade fine deflector plate 28 is shown. The fine deflector plate is comprised of ten molybdenum deflector blades 30 uniformly spaced and bonded to ceramic rods inserted through holes at opposite ends of each blade and run the width of the assembly. Alternate blades 30 are electrically connected.

Machined into the four corners of the fine deflector plate 28 are slots 34, 36, 38 and 40. These are arranged on the fine deflector plate 28 and oriented relative to each other as discussed above in relation to the lens plate 10.

Figure 4:
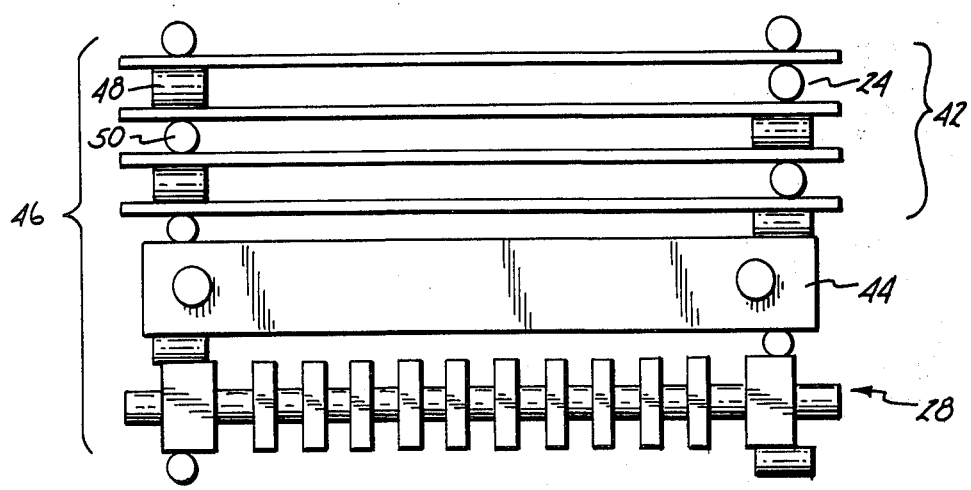
FIG. 4 is a side plan view of an entire array structure including four lens plates and two fine deflector plates, as well as the cylindrical rod spacers of the present invention.

As shown in FIG. 4, the cylindrical rods' 24 orientation in alternate plate layers is rotated 90 degrees. For instance, cylindrical rod 48 is orientated at right angles to cylindrical rod 50 on the layer just immediately below it. This arrangement, while not mandatory, provides an additional source of dimensional stability to the structure.

The entire (or parts thereof) structure 46 may be held together by biasing means, such as springs (not shown), or the plates may be held together by a bonding means.

A preferred bonding means is a cementitious bonding means. One such bonding means is a glass bonding means. In this process the cylindrical rods 24 are inserted into the slots on the respective plates and the structure temporary held together by a biasing means. A borosilicate glass powder is then inserted into the slots and the joints fired at 1100° C. in $N_2$ for approximately 15 minutes. The glass powder melts and forms a glass bond at the joint.

It is to be noted that the array structure 46 itself may be mounted on adjoining structures by the means herein disclosed.

The enumeration of specific elements of the preferred embodiment is not by limitation on the scope of the appended claims in which we claim:

1. Mounting and alignment apparatus for an electron beam lens optics of a type having two or more parallel plates, comprising:
   four slots formed in each plate, each slot spaced from the others, each slot possessing a long linear portion, the linear portion of one slot parallel with that of the diagonally opposed slot and orthogonal with those of the laterally adjacent slots;
   the slots being arranged on the plate at the corners of an imaginary rectangle; the imaginary rectangles for each plate being of the same dimensions;
   at least four cylindrical rods having a diameter sufficient for the circumference thereof to contact the opposite sides of the linear portion of a slot simultaneously;
   said rods and plates arranged wherein said at least four rods are each in simultaneous contact with one slot on two opposed plates; and
   means for maintaining said plates and said rods in said arrangement.

2. The apparatus of claim 1 wherein at least two of said plates are composed of silicon and said slots are formed by an etching process.

3. The apparatus of claim 1 wherein said rods are composed of a ceramic material.

4. The apparatus of claims 1, 2 or 3 wherein said means for maintaining is a glass bond.

5. The apparatus of claim 1 where in the case of more than two plates, the slots of one plate-rod-plate arrangement are arranged orthogonally to the slots of an alternate plate-rod-plate arrangement.

6. The apparatus of claim 5 wherein the imaginary rectangles on all plate surfaces are substantially congruent.

7. The apparatus of claim 1 or 3 wherein said rods are hollow.

8. The apparatus of claims 1, 2 or 3 wherein said means for maintaining is a cementitious bond.

* * * * *